United States Patent
Yamamoto

(10) Patent No.: US 6,767,426 B1
(45) Date of Patent: Jul. 27, 2004

(54) METHOD OF CUTTING A PROTECTIVE TAPE AND PROTECTIVE TAPE APPLYING APPARATUS USING THE SAME METHOD

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/341,389

(22) Filed: Jan. 14, 2003

(30) Foreign Application Priority Data

Jan. 17, 2002 (JP) ........................................ 2002-008637

(51) Int. Cl.⁷ ............................ B32B 31/00; B26D 5/00
(52) U.S. Cl. ...................... 156/270; 156/267; 156/353; 156/522; 156/523; 156/552; 29/25.01; 83/34; 83/56
(58) Field of Search ................................ 156/270, 522, 156/523, 552, 250, 530, 267, 353; 29/25.01; 83/34, 56

(56) References Cited

U.S. PATENT DOCUMENTS 4,865,677 A * 9/1989 Matsushita et al. ......... 156/353

* cited by examiner

Primary Examiner—Linda L. Gray
(74) Attorney, Agent, or Firm—Rader, Fishman & Grauer PLLC

(57) ABSTRACT

A control section controls an operation of a vertical drive section for vertically moving a cutter unit, and thereby, a blade edge position (height) of the cutter unit can be set and changed with micro intervals. Namely, when cutting a protective tape applied onto a surface of wafer, a contact portion of the protective tape and the blade edge is properly changed, and thereby, the protective tape can be always cut by a sharp blade edge along an outline of the wafer.

16 Claims, 5 Drawing Sheets

METHOD OF CUTTING A PROTECTIVE TAPE AND PROTECTIVE TAPE APPLYING APPARATUS USING THE SAME METHOD

BACKGROUND OF THE INVENTION

(1) Field of the Invention

The present invention relates to a technique of cutting a protective tape applied onto the surface of semiconductor wafer on which a pattern is formed.

(2) Description of the Related Art

Conventionally, in a semiconductor wafer manufacturing process, various methods have been employed to process the back surface of semiconductor wafer (hereinafter, referred simply to as "wafer") so that the thickness thereof can be reduced. The methods include mechanical process such as grinding or polishing, or chemical process such as etching. When the above process is used to process the wafer, a protective tape is applied onto the surface of wafer in order to protect the surface of the wafer having wiring pattern thereon.

The protective tape is applied in the following manner. A protective tape is applied onto the surface of the wafer sucked and held on a chuck table, thereafter, the protective tape applied onto the wafer is cut along the outline of the wafer by a cutter unit. In cutting the protective tape, the blade edge of the cutter unit contacting with the protective tape has a specified portion always repeatedly used.

The protective tape is cut, thereafter, unwanted tape is separated and collected, and the work for applying the protective tape is completed.

In recent years, with high-density packaging of semiconductor wafer, there is a tendency for the wafer to be thinned. The wafer is thinned as described above, and thereby, the rigidity of wafer is reduced, and further, warp occurs in the wafer. In order to improve the rigidity of wafer and to prevent the warp, a hard and thick protective tape is applied onto the surface of the wafer.

However, the above hard and thick protective tape is used, and thereby, the following problems arise.

More specifically, the hard and thick protective tape is cut, and thereby, the edge of the cutter contacting with the protective tape early wears; as a result, sharpness of the blade is early lost. In such a state, if the work for cutting the protective tape applied onto the wafer is continued, thrust increases in cutting, and stress by the thrust is applied to the wafer. As a result, there is a problem of breaking down the wafer.

In addition, the blade edge early wears; for this reason, the worn edge must be frequently replaced with a new blade edge. This is a factor of reducing a working efficiency.

SUMMARY OF THE INVENTION

The present invention has been proposed in view of the above circumstances. It is, therefore, a principal object of the present invention to provide a method of cutting a protective tape, which can continuously and effectively apply a protective tape onto the surface of semiconductor wafer. Another object of the present invention is to provide a protective tape applying apparatus employing the method same as above.

In order to achieve the above objects, according to one aspect of the present invention, there is provided a method of cutting a protective tape applied on a surface of semiconductor wafer along an outline of the semiconductor wafer by a cutter, comprising:

a step of displacing a contact portion of a blade edge of the cutter to the protective tape so that the protective tape can be cut.

According to the present invention, in the above method of cutting a protective tape, when cutting the protective tape applied onto the semiconductor wafer along the outline of the wafer, the contact portion of the blade edge of the cutter is displaced. Therefore, even if the sharpness of specified blade edge portions is lost, it is possible to cut the protective tape using other sharp blade edge portions. This serves to reduce the stress by thrust applied to the semiconductor wafer when cutting the protective tape. As a result, the semiconductor wafer can be prevented from being broken down.

In addition, the contact portion of the blade edge is displaced, and thereby, it is possible to cut the protective tape by one cutter for a long time. As a result, there is no need of frequently replacing the blade edge with a new blade edge; therefore, a working efficiency can be improved.

In the present invention, preferably, the displacement of the contact portion of a blade edge of the cutter to the protective tape is set to a predetermined interval. Preferably, when cutting the protective tape along an outline of the semiconductor wafer, the contact portion of a blade edge of the cutter to the protective tape is displaced while being vertically moving with the elapse. The interval setup of the contact portion of a blade edge of the cutter to the protective tape is made by vertically moving a cutter unit including the cutter and by vertically moving holding means for placing and holding the semiconductor wafer. The contact portion of the blade edge of the cutter to the protective tape during cutting of the protective tape is displaced with the elapse by vertically moving a cutter unit including the cutter and by vertically moving holding means for placing and holding the semiconductor wafer.

That is, in the process of cutting the protective tape, the contact portion of the blade edge to the protective tape is readily changed. As a result, it is possible to always cut the protective tape using sharp blade edge, and to cut the protective tape by one cutter for a long time.

The protective tape is applied onto the surface of the semiconductor wafer, thereafter, cut. In this case, the protective tape may comprise a single sheet, or may comprise a tape previously laminating the same or different kind of protective tapes. The protective tape may be cut into a shape having a diameter larger than an outer diameter of the semiconductor wafer.

In order to achieve the above objects, according to another aspect of the present invention, there is provided a protective tape applying apparatus for applying a protective tape onto a surface of semiconductor wafer, comprising:

holding means for placing and holding the semiconductor wafer;

tape supplying means for supplying a protective tape to the held semiconductor wafer;

applying means for applying the supplied protective tape onto the surface of the semiconductor wafer;

a cutter unit cutting the protective tape applied onto the semiconductor wafer along an outline of the semiconductor wafer;

first vertical drive means for vertically moving the cutter unit;

first control means for controlling the operation of the first vertical drive means so that a contact portion of a blade edge of the cutter unit to the protective tape can be displaced;

separating means for separating unwanted tape after cutting the protective tape by the cutter unit; and collecting means for collecting the separated unwanted tape.

According to the present invention, in the protective tape applying apparatus, the protective tape is applied onto the surface of the semiconductor wafer held by the holding means. The protective tape is cut by the cutter unit by along the outline of the semiconductor wafer; in this case, the first control means controls the vertical movement of the cutter unit. Therefore, since the blade edge position of the cutter unit is set and changed by the first control means, the blade edge portion losing sharpness due to wear can be replaced with a sharp blade edge having no wear.

According to the present invention, the apparatus further includes second vertical drive means for vertically moving the holding means, and second control means for controlling the operation of the second vertical drive means so that a contact portion of a blade edge of the cutter unit to the protective tape can be displaced.

With the above construction, the second control means controls the vertical movement of the holding means so that the contact portion of the blade edge of the cutter to the protective tape can be set and changed. Therefore, the blade edge portion losing sharpness due to wear can be replaced with a sharp blade edge having no wear.

BRIEF DESCRIPTION OF THE DRAWINGS

For the purpose of illustrating the invention, there are shown in the drawings several forms, which are presently preferred, it being understood, however, that the invention is not limited to the precise arrangement and instrumentalities.

DETAILED DESCRIPTION OF THE PREFERRED EMBODIMENTS

Preferred embodiments of the present invention will be described below with reference to the accompanying drawings.

Figure 1:
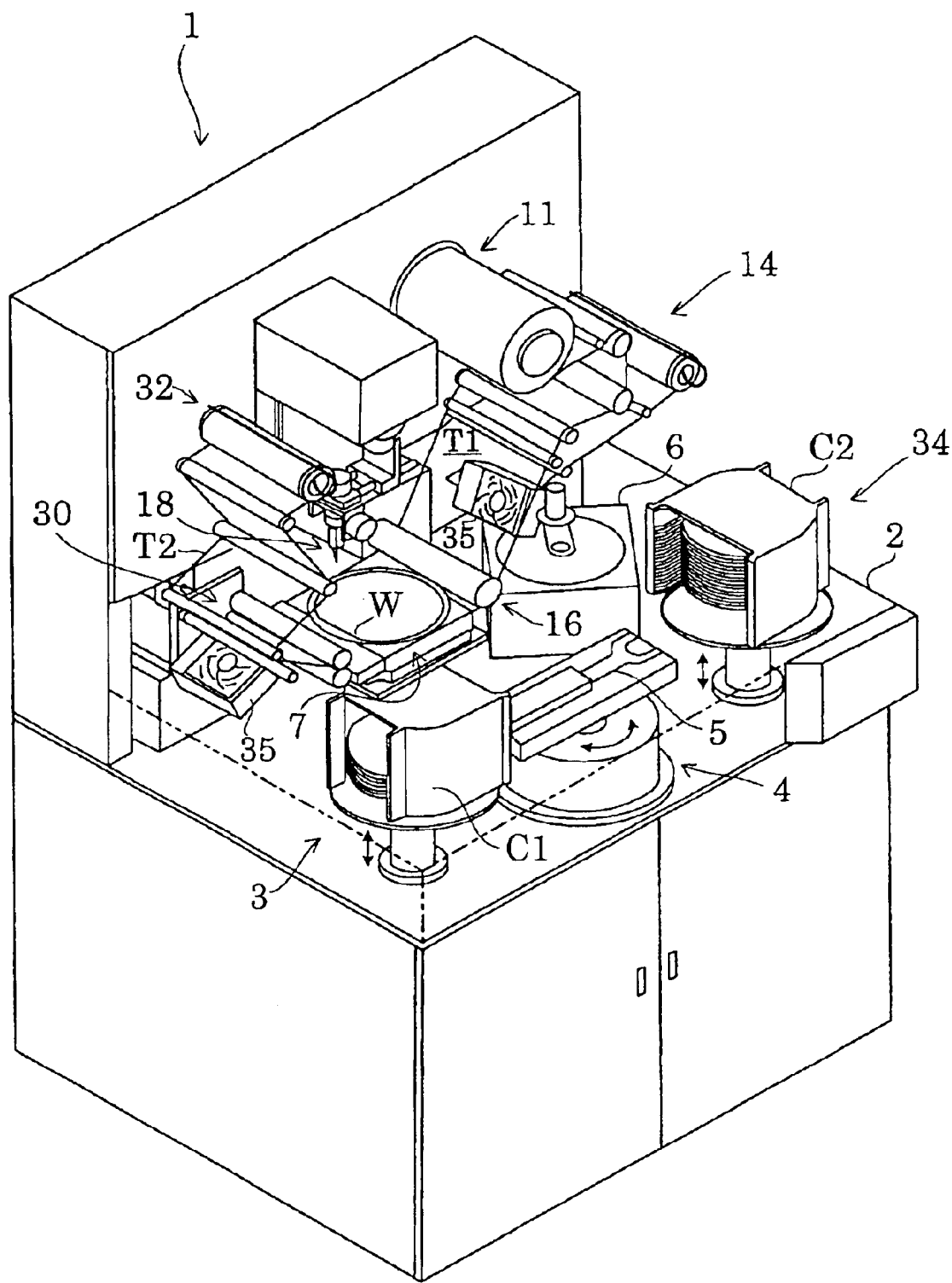
FIG. 1 is a perspective view schematically showing the structure of a protective tape applying apparatus according to the present invention.

FIG. 1 is a perspective view schematically showing the structure of a protective tape applying apparatus.

According to one embodiment, a protective tape applying apparatus 1 for semiconductor wafer (hereinafter, referred simply to as "wafer") includes a wafer supplier 3 and a wafer collector 34. The wafer supplier 3 is arranged at the left of the near side of a base plate 2, and is loaded with a cassette C1 storing wafers W. The wafer collector 34 is arranged at the right of the same as above, and is used to collect wafers W with a protective tape T1 applied on the surface. A wafer transport mechanism 4 is interposed between the wafer supplier 3 and the wafer collector 34. The base plate 2 is provided with an alignment stage 6 at the right of the far side. A tape server 11 for supplying the protective tape T1 to the wafer W is provided above the alignment stage 6. A separator collector 14 is arranged on the obliquely right side under the tape server 11. The separator collector 14 collects only separator from the protective tape T1 with separator supplied from the tape server 11. A chuck table 7, a tape applying mechanism 16 and a tape separating mechanism 30 are arranged on the left side of the alignment stage 6. The chuck table 7 sucks and holds the wafer W, and the tape applying mechanism 16 applies the protective tape T1 onto the wafer W held on the chuck table 7. The tape separating mechanism 30 separates unwanted tape after the protective tape T1 is applied onto the wafer W. A cutter mechanism 18 is arranged above the tape separating mechanism 30. The cutter mechanism 18 cuts the protective tape T1 applied onto the wafer W along the outline of the wafer W. A tape collector 32 for collecting the unwanted tape is arranged above on the left side of the base plate 2. A static electricity eliminator 35 is arranged at the side opposite to the chuck table 7. The static electricity eliminator 35 eliminates static electricity from the protective tape before being applied onto the wafer W and unwanted tape T2 before being collected after the protective tape T1 applied onto the wafer W.

The following is a detailed description on each of the above mechanisms.

The wafer supplier 3 includes a vertically movable cassette table, and the cassette C1 storing wafers in the multiple stage form is placed on the cassette table. In this case, the wafer W is horizontally kept in a state that the pattern surface is upwardly directed.

The wafer transport mechanism 4 is provided with a robot arm 5, and is configured so that it can be rotated by a drive mechanism (not shown).

The robot arm 5 includes a horseshoe-shaped wafer retainer at the distal end. The wafer retainer is formed with a suction hole (not shown) so that the wafer W can be vacuum-sucked from the back side.

More specifically, the robot arm 5 sucks and holds the wafer W from the back side in a manner that the wafer retainer is inserted into the clearance between wafers W stored in the cassette C1 in the multiple stage form. Further, the robot arm 5 carries the sucked and held wafer W in the order of the alignment stage 6, chuck table 7 and wafer collector 34, which will be described later.

The alignment stage 6 performs the alignment of the placed wafer W based on orientation flat.

Figure 2:
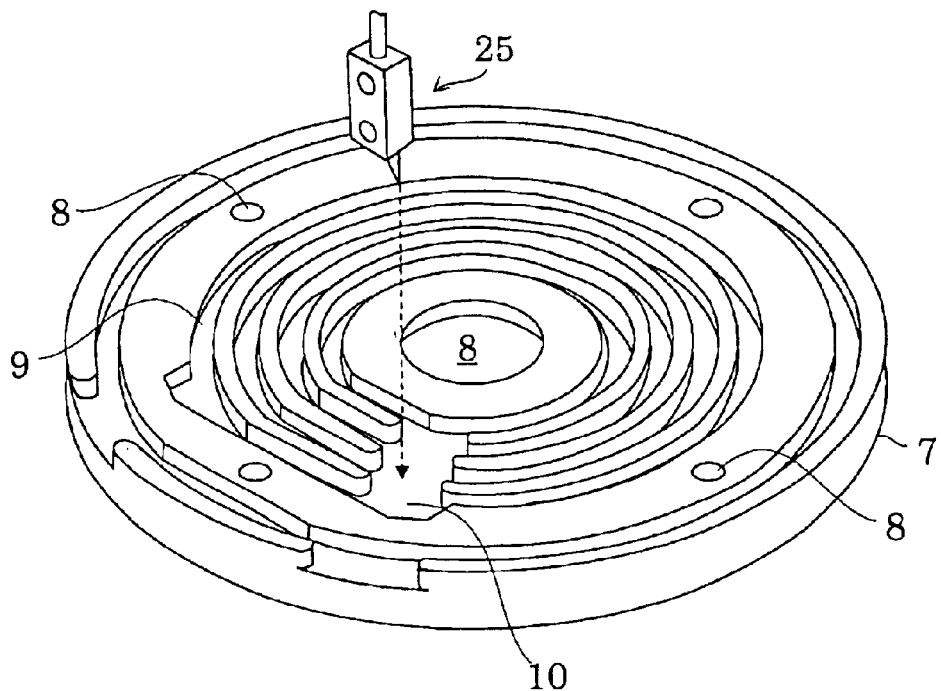
FIG. 2 is a perspective view showing the structure of a chuck table.

The chuck table 7 performs the alignment based on orientation flat of the transferred and placed wafer W, and fully covers the back surface of the wafer W so that the wafer W can be vacuum-sucked. Namely, the chuck table 7 is formed with suction holes 8 at the outer peripheral portion and the central portion, as seen from FIG. 2.

Further, the chuck table 7 is formed with grooves 9 into which a blade edge 25 of the cutter unit 20 described later is inserted in order to cut the protective tape T1 along the outline of the wafer W. In this case, a plurality of grooves 9 is formed correspondingly to the outline of the wafer having different size. A wide groove 10 is formed along the radius direction of the chuck table 7 at the initial position (left-handed near side in FIG. 2) of the grooves 9 into which the blade edge 25 of the cutter unit 20 is inserted. The groove 10 is connected with all of the above grooves 9. Incidentally, the chuck table 7 is equivalent to holding means of the present invention.

Figure 5:
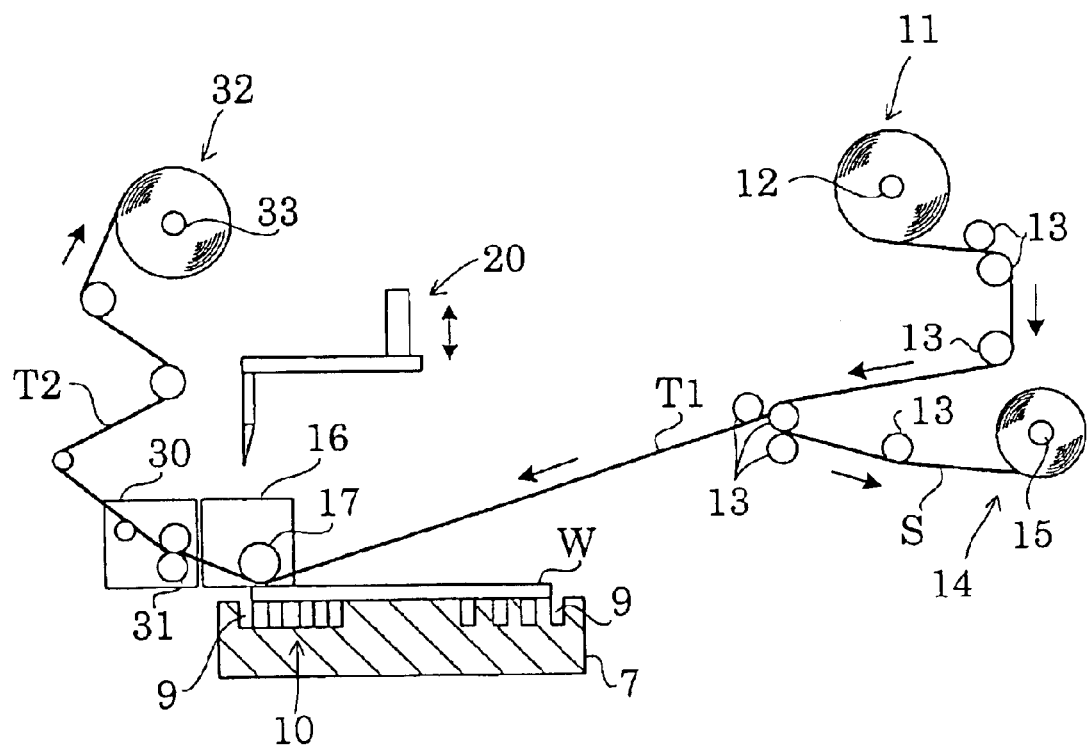
FIG. 5 is a schematic front view to explain a tape applying process.

As illustrated in FIG. 5, the tape server 11 guides the protective tape T1 with separator S fed from a tape bobbin 12 while winding it around the group of guide rollers 13. In this case, the tape server 11 is rotatably supported to a longitudinal wall of the apparatus main body, and is controlled in its rotation via a break mechanism.

The separator collector 14 includes a collector bobbin 15, which is rotatably supported to the longitudinal wall, and interlocked and connected with a drive mechanism such as a motor.

The tape applying mechanism 16 is held on a rail of the apparatus main body so that the frame is slidable in the tape traveling (running) direction, and interlocked and connected with a drive mechanism (not shown). An applying roller 17 is rotatably supported to the frame, and is vertically swung by a cylinder (not shown). In other words, the applying roller 17 presses the surface of the protective tape T1 while rolling thereon so that the protective tape T1 can be applied onto the surface of the wafer W. Incidentally, the above tape applying mechanism 16 is equivalent to applying means of the present invention.

Figure 3:
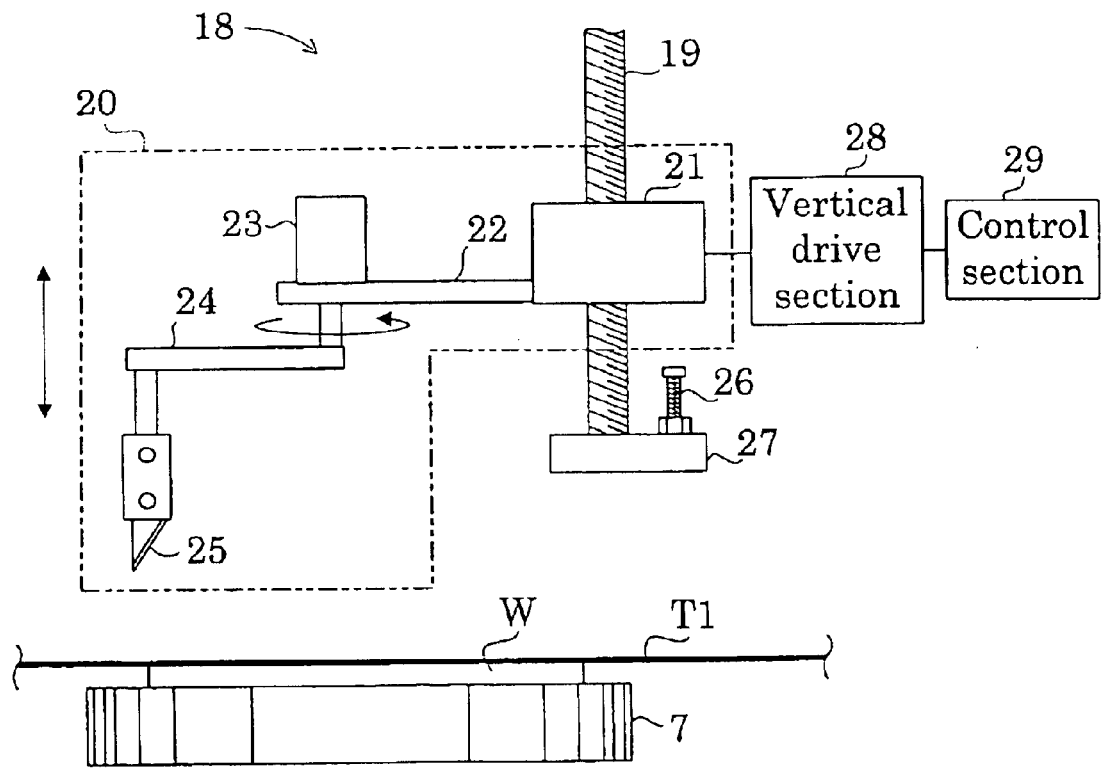
FIG. 3 is a view including a block diagram to explain the structure of a cutter mechanism.

The cutter mechanism 18 includes a cutter unit 20 (portion surrounded by a two-dotted chain line), a vertical drive section 28, and a control section 29, as shown in FIG. 3. The cutter unit 20 is attached to a ball shaft so that it is vertically movable. The vertical drive section 28 moves the cutter unit 20 in the vertical direction. The control section 29 controls the vertical drive section 28.

The above cutter unit 20 comprises a vertically movable member 21, an arm 22, a motor 23, a rotatable arm 24, and a cutter blade edge 25. The arm 22 is supported to the vertically movable member 21 like cantilever bridge. The motor 23 is attached to the upper portion of the distal end of the arm 22. The arm 24 has one end connected to the rotary shaft of the motor 23, which downwardly extends and penetrates through the arm 22. The cutter blade edge 25 is attached downwardly to the other end of the arm 24.

The vertically movable member 21 is vertically movable along the ball shaft 19. In addition, a stopper 26 is provided via a bottom plate 27 at the bottom portion of the ball shaft 19. The stopper 26 is used to control the lowest position (height) of the vertically movable member 21.

The motor 23 transmits a moment of rotation to the arm 24 via the rotary shaft so that the arm 24 can be rotated.

As seen from FIG. 3, the stopper 26 is formed into a shape of screw, and is screwed into the bottom plate 27 so that the lowest position of the vertical movable member 21 can be adjusted. In this case, the stopper is not limited to the above shape of screw. For example, the stopper may be of course other than forms so long as it can control the lowest position of the vertical movable member 21.

The control section 29 controls the vertical drive section 28 so that the cutter unit 20 can be vertically moved between a standby position and the operating position of cutting the protective tape T1. Further, the control section 29 changes the contact portion of the protective tape T1 and the blade edge 25 of the cutter unit 20. Incidentally, the control section 29 and the vertical drive section 28 are equivalent to control means and vertically driving means, respectively.

Figure 4:
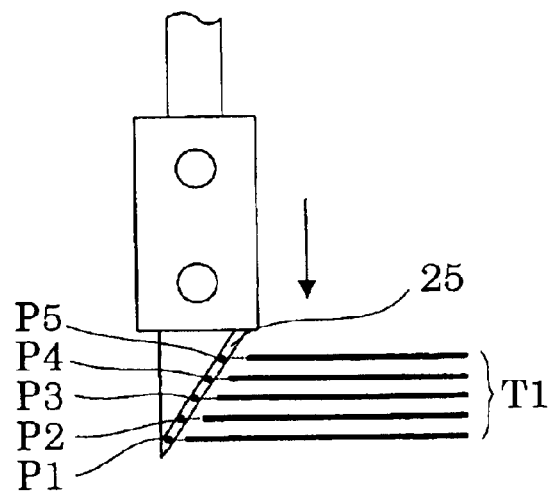
FIG. 4 is a view showing a contact portion of a protective tape and a blade edge.

More specifically, the control section 29 displaces the contact portion of the blade edge 25 to the protective tape T1 at micro unit (interval). For example, as shown in FIG. 4, the control section 29 controls the blade edge 25 so that the protective tape T1 can be repeatedly cut successively using blade edge contact portions P1 to P5 preset with predetermined intervals. The contact portion may be properly modified depending on the number of cutting protective tapes corresponding to the kind of the protective tape.

The tape separating mechanism 30 is held to a rail of the apparatus main body so that the frame is slidable in the tape traveling direction, and interlocked and connected via a drive mechanism such as a motor (not shown). A separating roller 31 is rotatably supported to the frame, and is vertically swung by a cylinder (not shown). The separating roller 31 is used to separate unwanted tape T2 after being cut along the outer periphery of the wafer W from the wafer W.

A tape collector 32 includes a collector bobbin 33, which is rotatably supported to the longitudinal wall of the base plate, and interlocked and connected with a drive mechanism such as a motor. More specifically, when a predetermined amount of the protective tape T1 is fed from the tape server 11, and supplied onto the wafer W, the driving section is operated so that the unwanted tape T2 after cutting the protective tape T1 can be wound up the collector bobbin 33.

The wafer collector 34 includes a vertically movable cassette table, and a cassette C2 is placed on the cassette table. The cassette C2 stores wafers having the protective tape applied on the surface in the multiple stage form. In this case, the wafer W is horizontally kept in a state that the pattern surface is upwardly directed.

The operation flow of applying the hard and thick protective tape T1 onto the surface of the wafer W using the above apparatus will be described below with reference to the drawings.

When the cassette C1 storing the wafer W in the multiple stage form is placed on the cassette table of the wafer supplier 3, the cassette table is vertically moved, thereafter, stopped at the position capable of taking out a wafer, which is an object to be taken, by the robot arm 5.

The wafer transport mechanism 4 is rotated so that the wafer retainer of the robot arm 5 can be inserted into the clearance between wafers stored in the cassette C1. The robot arm 5 takes out the wafer W in a state that the wafer retainer sucks and holds it from the back surface, and transfers the wafer W to the alignment stage 6.

The wafer W placed on the alignment stage 6 is positioned based on orientation flat and notch. After positioning is completed, the wafer W is transferred onto the chuck table in a state of being sucked and held from the back surface by the robot arm 5.

The wafer W placed on the chuck table 7 is positioned, thereafter, sucked and held. In this case, as seen from FIG. 5, the tape applying mechanism 16 and the tape separating mechanism 30 are situated on the initial position (left side of the chuck table 7), and the cutter unit 20 is situated on the standby position (above tape applying mechanism 16).

The alignment of the wafer W is completed, thereafter, the applying roller 17 of the tape applying mechanism 16 swung downward. The applying roller 17 rolls on the wafer W to a direction (from the left to the right in FIG. 6) reverse to the tape traveling direction while pressing down the protective tape T1. Therefore, the protective tape T1 can be uniformly applied to the entire surface of the wafer W. Thereafter, when the tape applying mechanism 16 reaches the completion position, the applying roller is raised.

Figure 6:
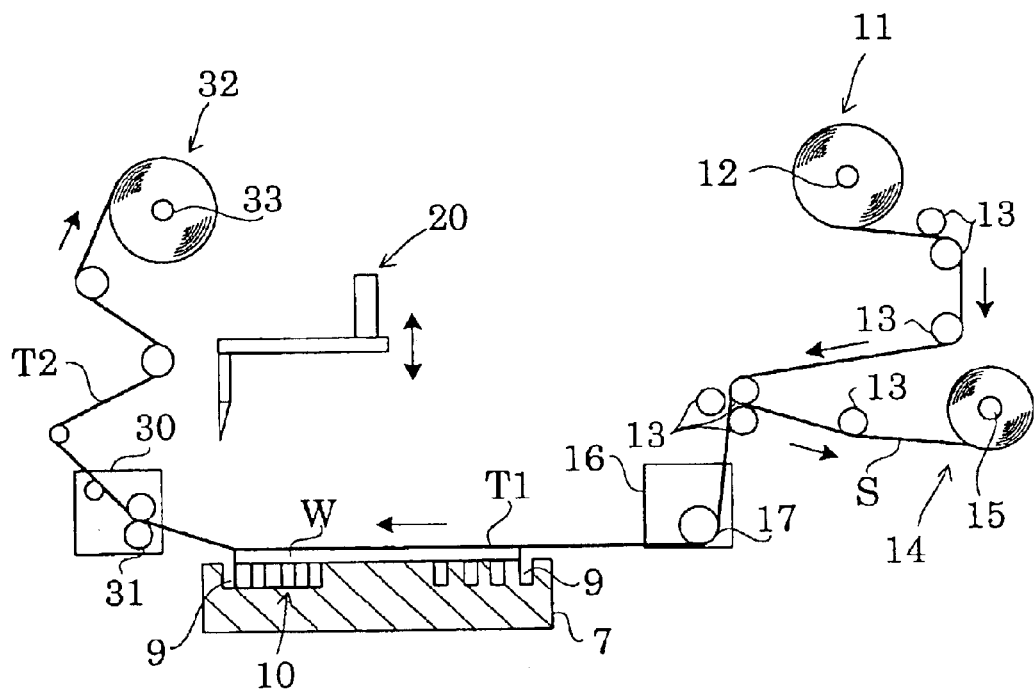
FIG. 6 is a schematic front view to explain a tape applying process.
Figure 7:
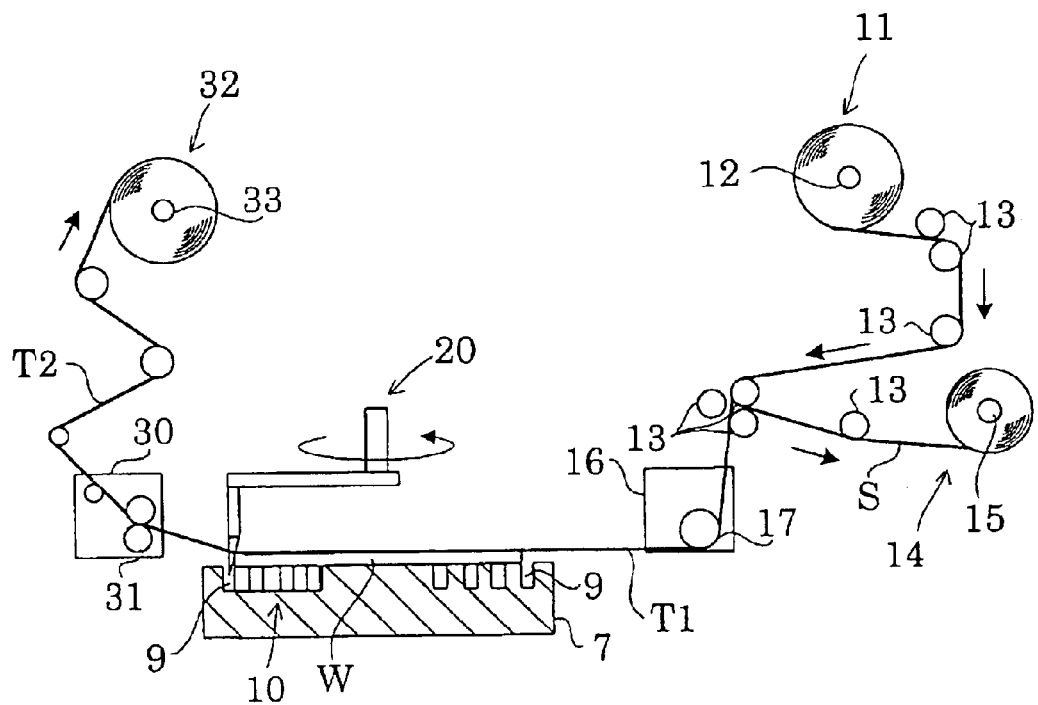
FIG. 7 is a schematic front view to explain a tape applying process.

As shown in FIG. 6, the cutter unit 20 moves down to the cutting position so that the blade edge 25 sticks through the protective tape. In this case, the blade edge 25 through the protective tape T1 is stopped at a predetermined position (height) of the groove 10 by the control section 29. The blade edge 25 stopped at the predetermined position moves along the groove formed in the chuck table 7. In other words, the blade edge 25 cuts the protective tape T1 along the outline of the wafer W. In this case, tension is applied to the protective tape T1 by the tape applying mechanism 16 and the tape separating mechanism 30.

Figure 8:
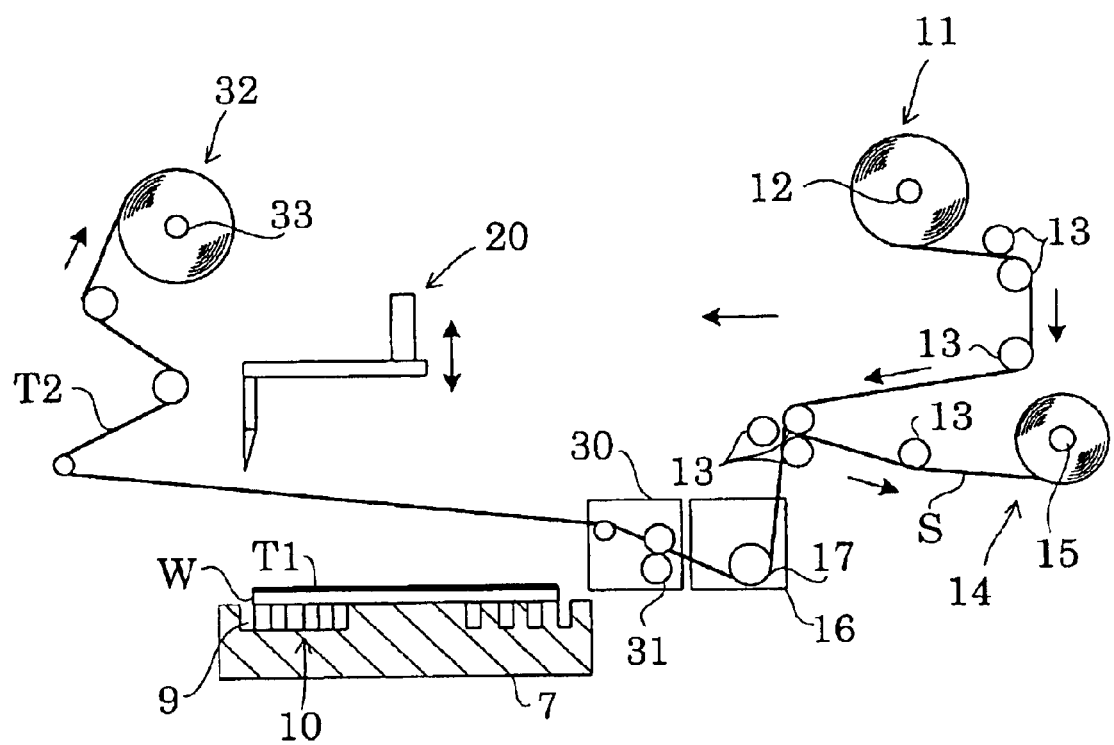
FIG. 8 is a schematic front view to explain a tape applying process.

After cutting the protective tape T1, the cutter unit 20 moves up, and returns to the standby position, as illustrated in FIG. 8.

As seen from FIG. 8, the tape separating mechanism 30 winds up and separates unwanted tape T2 cut on the wafer W while moving on the wafer W to the direction reverse to the tape traveling direction.

When the tape separating mechanism 30 reaches the separating work completion position, the tape applying mechanism 16 and the tape separating mechanism 30 move to the tape traveling direction, and return to the initial position shown in FIG. 5. In this case, the unwanted tape T1 is wound up the collector bobbin 33 while a predetermined amount of the protective tape T1 being fed from the tape server 11. In the above manner, the process flow of the operation for applying the protective tape T1 onto the surface of the wafer W completes.

In the process of repeating the above operation, in accordance with the kind of the protective tape T1 and the number of cut protective tape T1, the control section 29 controls the operation of the vertical drive section 28 so that the height of the cutter unit 20 can be adjusted. In other words, the contact portion of the blade edge 25 to the protective tape T1 is changed so that the protective tape T1 can be always cut using the sharp portion of the blade edge 25.

As described above, the contact portion of the blade edge 25 of the cutter unit 20 to the protective tape T1 is properly changed, and thereby, the protective tape T1 can be always cut using the sharp portion of the blade edge 25. This serves to reduce the stress by thrust applied to the wafer W when the protective tape T1 is cut by the blade edge 25 having no sharpness. Therefore, there is no need of breaking down the wafer W and frequently replacing the blade edge 25 with a new blade edge; as a result, the protective tape T1 can be effectively applied onto the surface of the wafer W, and the working efficiency can be improved.

The present invention is not limited to the above embodiment, and the following modifications may be possible.

(1) In the apparatus of the above embodiment, the contact portion of the blade edge 25 and the protective tape T1 is set to predetermined intervals, and properly changed, and thus, the protective tape T1 is cut. The following modification may be made.

In the process of cutting the protective tape T1 along the outline of the wafer W, the contact portion of the blade edge 25 and the protective tape T1 is displaced with the elapse while vertically moving the cutter unit 20, and thereby, the protective tape T1 may be cut.

(2) In the apparatus of the above embodiment, the height of the cutter unit 20 is controlled, and thereby, the contact portion of the protective tape T1 and the blade edge 25 is set and changed. The present invention is not limited to the embodiment. For instance, the chuck table 7 may be vertically moved so that the contact portion of the protective tape T1 and the blade edge 25 can be set and changed. In this case, the control section 29 may control the vertical movement of the chuck table 7, or independent control means may control it.

(3) In the above embodiment, the hard and thick protective tape T1 is used as the example. The present invention is not limited to the above protective tape T1. The present invention is applicable to the case where a soft protective tape or tape laminating several protective tapes is applied to the surface of the wafer W. In this case, the same or different kind of tape may be employed as the above tape laminating several protective tapes.

(4) In the above embodiment, the protective tape T1 is cut into the approximately same shape as the wafer W. The protective tape T1 may be cut into a shape having a diameter larger than the outer diameter (outline) of the wafer W.

The present invention may be embodied in other specific forms without departing from the sprit or essential attributes thereof and, accordingly, reference should be made to the appended claims, rather than to the forgoing specification, as indicating the scope of the invention.

What is claimed is:

1. A method of cutting a protective tape applied on a surface of semiconductor wafer along an outline of the semiconductor water at an operating position by a cutter, which is vertically movable between a standby position and the operating position for cutting the protective tape comprising:

a step of displacing the position of a blade edge of said cutter upwardly and downwardly relative to said protective tape so that the protective tape can be cut at the operating position using multiple points of the blade edge of the cutter.

2. A method of cutting a protective tape as defined in claim 1, wherein the displacement of the position of a blade edge of said cutter to said protective tape is set to a predetermined interval.

3. A method of cutting a protective tape as defined in claim 2, wherein the interval setup of the position of a blade edge of the cutter to said protective tape is made by vertically moving a cutter unit including said cutter.

4. A method of cutting a protective tape as defined in claim 2, wherein the interval setup of the position of a blade edge of the cutter to said protective tape is made by vertically moving holding means for holding said semiconductor wafer.

5. A method of cutting a protective tape as defined in claim 1, wherein when cutting the protective tape along an outline of said semiconductor wafer, the position of a blade edge of said cutter to said protective tape is displaced while being vertically moving with the elapse.

6. A method of cutting a protective tape as defined in claim 5, wherein the position of a blade edge of the cutter to said protective tape is displaced while vertically moving a cutter unit including said cutter.

7. A method of cutting a protective tape as defined in claim 5, wherein the position of a blade edge of the cutter to said protective tape is displaced while vertically moving holding means for holding said semiconductor wafer.

8. A method of cutting a protective tape as defined in claim 1, wherein said protective tape comprises a single sheet of tape.

9. A method of cutting a protective tape as defined in claim 1, wherein said protective tape comprises a tape previously laminating a plurality of protective tapes.

10. A method of cutting a protective tape as defined in claim 9, wherein said tape laminated protective tape comprises a tape laminating the same kind of protective tapes.

11. A method of cutting a protective tape as defined in claim 9, wherein said tape laminated protective tape comprises a tape laminating the different kind of protective tapes.

12. A method of cutting a protective tape as defined in claim 1, wherein said protective tape is cut into a shape having a diameter larger than an outer diameter of the semiconductor wafer.

13. A protective tape applying apparatus for applying a protective tape onto a surface of semiconductor wafer, comprising:

holding means for placing and holding said semiconductor wafer;

tape supplying means for supplying a protective tape to said held semiconductor wafer;

applying means for applying said supplied protective tape onto the surface of the semiconductor wafer;

a cutter unit cutting the protective tape applied onto said semiconductor wafer along an outline of said semiconductor wafer;

first vertical drive means for vertically moving said cutter unit;

first control means for controlling an operation of said first vertical drive means so that said cutter unit is vertically moved between a standby position and an operating position for cutting the protective tape, and so that the position of a blade edge of a cutter is displaced upwardly and downwardly relative to the protective tape at the operating position, and thereby multiple points on the blade edge of the cutter are used when the protective tape is cut;

separating means for separating unwanted tape after cutting the protective tape by said cutter unit; and collecting means for collecting said separated unwanted tape.

14. A protective tape applying apparatus as defined in claim 13, further including:

second vertical drive means for vertically moving said holding means.

15. A protective tape applying apparatus as defined in claim 14, further including:

second control means for controlling an operation of said second vertical drive means so that a position of the blade edge of said cutter unit to said protective tape can be displaced.

16. A method of cutting a protective tape as defined in claim 1, wherein the position of the blade edge of said cutter that makes contact with the protective tape is displaced whenever a predetermined number of protective tapes have been cut.

* * * * *